United States Patent [19]

Tan et al.

[11] Patent Number: 5,494,773
[45] Date of Patent: Feb. 27, 1996

[54] POSITIVE PHOTORESIST COMPOSITION COMPRISING A NOVOLAK RESIN HAVING A CYCLOALKYLIDENE-BISPHENOL GROUP

[75] Inventors: Shiro Tan; Yasumasa Kawabe; Tadayoshi Kokubo, all of Shizuoka, Japan

[73] Assignee: Fuji Photo Film Co., Ltd., Kanagawa, Japan

[21] Appl. No.: 399,046

[22] Filed: Mar. 6, 1995

[30] Foreign Application Priority Data

Apr. 12, 1994 [JP] Japan .................................. 6-073119

[51] Int. Cl.⁶ ..................................................... G03F 7/023
[52] U.S. Cl. ........................... 430/192; 430/165; 430/191; 430/193; 528/153; 528/155
[58] Field of Search ................................... 430/165, 192, 430/193, 191; 528/153, 155

[56] References Cited

U.S. PATENT DOCUMENTS

| | | | |
|---|---|---|---|
| 4,123,279 | 10/1978 | Kobayashi | 430/192 |
| 4,690,882 | 9/1987 | Tanigaki et al. | 430/192 |
| 5,225,310 | 7/1993 | Stahlhofen et al. | 430/165 |
| 5,395,727 | 3/1995 | Uetani et al. | 430/192 |

FOREIGN PATENT DOCUMENTS 2306245  12/1990  Japan .

*Primary Examiner*—Charles L. Bowers, Jr.
*Assistant Examiner*—John S. Chu
*Attorney, Agent, or Firm*—Sughrue, Mion, Zinn, Macpeak & Seas

[57] ABSTRACT

A positive photoresist composition comprising an alkali-soluble novolak resin and a 1,2-quinonediazide compound is described, wherein the alkali-soluble novolak resin contains a novolak resin to be obtained by condensing a mixture of (a) at least one phenol represented by the following formula (1) and at least one compound represented by the following formula (2) and (b) at least one aldehyde:

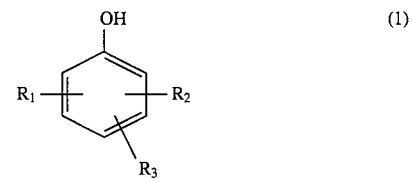

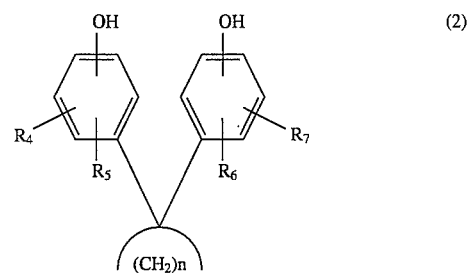

wherein $R_1$, $R_2$ and $R_3$ are the same or different and each represents a hydrogen atom, a hydroxyl group, a halogen atom, an alkyl group, an alkoxy group, an alkenyl group, an aryl group, an aralkyl group, an alkoxycarbonyl group or an arylcarbonyl group; $R_4$, $R_5$, $R_6$ and $R_7$ are the same or different and each represents a hydrogen atom, a hydroxyl group, a halogen atom, an alkyl group, a cycloalkyl group, an alkoxy group, an alkenyl group, an aryl group or an aralkyl group; and n represents an integer of from 4 to 7.

4 Claims, No Drawings

POSITIVE PHOTORESIST COMPOSITION COMPRISING A NOVOLAK RESIN HAVING A CYCLOALKYLIDENE-BISPHENOL GROUP

FIELD OF THE INVENTION

The present invention relates to a positive photoresist composition sensitive to radiations. In particular, it relates to a positive photoresist composition having high resolution and high sensitivity, which is used for forming fine photoresist patterns with good cross-sectional profiles.

BACKGROUND OF THE INVENTION

The positive photoresist of the present invention is coated on a substrate, such as semiconductor wafers, glass, ceramics, or metals, by spin coating or roller coating, at a thickness of approximately from 0.5 to 3 µm. After thus coated, this is heated, dried and exposed to, e.g., ultraviolet rays, via an exposure mask, to form a circuit pattern or the like on the substrate. After thus exposed, this is then developed to give a positive image on the substrate.

In addition, the substrate having the thus-formed positive image thereon is etched, using the positive image as a mask, to have a pattern thereon. One typical technical filed to which the photoresist is applied includes manufacture of semiconductor devices such as IC, manufacture of circuit substrates for liquid crystal displays, thermal heads, and other photofabrication processes.

Positive photoresist compositions generally comprise an alkali-soluble resin and, as a photosensitive substance, a naphthoquinonediazide compound. For instance, compositions comprising novolak phenolic resins and substituted naphthoquinonediazide compounds are disclosed in U.S. Pat. Nos. 3,666,473, 4,115,128 and 4,173,470. As the most typical compositions, examples comprising cresol-formaldehyde novolak resins and trihydroxybenzophenone- 1,2-naphthoquinonediazido sulfonates are disclosed in L. F. Thompson, *Introduction to Microlithography* (published by ACS, No. 219, pp. 112–121).

Novolak resin as a binder is soluble in an aqueous alkaline solution, without being swollen. In addition, it is highly resistant to plasma etching, when formed image is used as a mask for etching. Therefore, the novolak resins are especially advantageous as binder in this use. Naphthoquinonediazide compound used for a photosensitive substance acts by itself as a dissolution inhibitor capable of reducing the solubility of novolak resins in alkalies but, when exposed to light, specifically decomposes to give an alkali-soluble substance which rather increases the solubility of novolak resins in alkalies. Due to such significant variation in their properties relative to exposure to light, naphthoquinonediazide compounds are especially useful as photosensitive substances in positive photoresists.

Accordingly, many positive photoresists containing novolak resins and naphthoquinonediazide-based photosensitive components have heretofore been developed and put to practical use. These have produced sufficient results in forming line patterns on a level of approximately from 1.5 µm to 2 µm.

However, the degree of integration in integrated circuits is desired to be increased more and more in these days, and it has become necessary to produce ultra-fine patterns having a line width of 1 µm or less in the production of semiconductor substrates for ultra-LSI. In such use, photoresists having high resolution and high sensitivity are needed, in order that they can correctly transcribe the profiles of exposure masks with high reproduction accuracy to reproduce correct patterns at high reproducibility. However, the above-mentioned conventional positive photoresists cannot satisfy these requirements.

SUMMARY OF THE INVENTION

An object of the present invention is to provide the following compositions, which are useful in production of semiconductor devices:

(1) a positive photoresist composition having high resolution;

(2) a positive photoresist composition capable of correctly reproducing the mask dimension over a broad range of various line widths of photo masks;

(3) a positive photoresist composition capable of forming resist patterns having a line width of 1 µm or less in such a way that the cross-sectional profile of the patterned line has a high aspect ratio;

(4) a positive photoresist composition capable of forming resist patterns having nearly vertical side walls in their cross sections;

(5) a positive photoresist composition having a broad latitude for development; and (6) a positive photoresist composition capable of forming resist images having high heat resistance.

This and other objects of the present invention have been attained by a positive photoresist composition comprising an alkali-soluble novolak resin and a 1,2-quinonediazide compound, wherein the alkali-soluble novolak resin contains a novolak resin to be obtained by condensing (a) a mixture of at least one phenol represented by the following formula (1) and at least one compound represented by the following formula (2) and (b) at least one aldehyde:

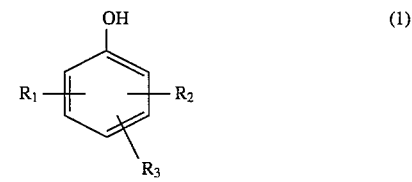

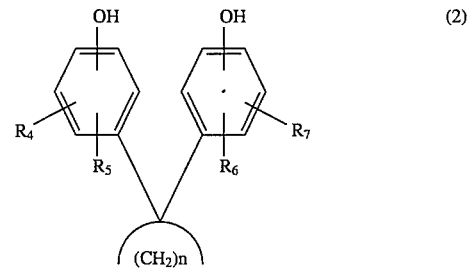

wherein $R_1$, $R_2$ and $R_3$ ($R_1$ to $R_3$) are the same or different and each represents a hydrogen atom, a hydroxyl group, a halogen atom, an alkyl group, an alkoxy group, an alkenyl group, an aryl group, an aralkyl group, an alkoxycarbonyl group or an arylcarbonyl group;

$R_4$, $R_5$, $R_6$ and $R_7$ ($R_4$ to $R_7$) are the same or different and each represents a hydrogen atom, a hydroxyl group, a halogen atom, an alkyl group, a cycloalkyl group, an alkoxy group, an alkenyl group, an aryl group or an aralkyl group; and n represents an integer of from 4 to 7.

DETAILED DESCRIPTION OF THE INVENTION

The present invention will be described in detail hereunder.

For $R_1$ to $R_3$ in formula (1), the halogen atom is preferably a chlorine atom, a bromine atom or an iodine atom; and the alkyl group is preferably an alkyl group having from 1 to 4 carbon atoms, such as a methyl group, an ethyl group, a propyl group, an n-butyl group, an isobutyl group, a sec-butyl group or a t-butyl group, and it is especially preferably a methyl group in view of the sensitivity of the photoresist of the invention. The alkoxy group is preferably an alkoxy group having from 1 to 4 carbon atoms, such as a methoxy group, an ethoxy group, a hydroxyethoxy group, a propoxy group, a hydroxypropoxy group, an isopropoxy group, an n-butoxy group, an isobutoxy group, a sec-butoxy group or a t-butoxy group, more preferably a methoxy group or an ethoxy group. The alkenyl group is preferably an alkenyl group having from 2 to 4 carbon atoms, such as a vinyl group, a propenyl group, an allyl group or a butenyl group, more preferably a vinyl group or an allyl group. The aryl group is preferably a phenyl group, a xylyl group, a toluyl group or a cumenyl group, more preferably a phenyl group. The aralkyl group is preferably a benzyl group, a phenethyl group or a cumyl group, more preferably a benzyl group. The alkoxycarbonyl group is preferably a methoxycarbonyl group or an ethoxycarbonyl group, more preferably a methoxycarbonyl group. The arylcarbonyl group is preferably a benzoyloxy group.

Specific examples of the phenols represented by formula (1) include phenol, cresols (e.g., o-cresol, m-cresol, p-cresol), xylenols (e.g., 2,5-xylenol, 3,5-xylenol, 3,4-xylenol, 2,3-xylenol, 2,4-xylenol, 2,6-xylenol), alkylphenols (e.g., o-ethylphenol, m-ethylphenol, p-ethylphenol, p-t-butylphenol), alkoxyphenols (e.g., o-methoxyphenol, m-methoxyphenol, p-methoxyphenol, o-ethoxyphenol, m-ethoxyphenol, p-ethoxyphenol, 3,5-dimethoxyphenol, 2-methoxy-4-methylphenol, o-propoxyphenol, m-propoxyphenol, p-propoxyphenol, o-butoxyphenol, m-butoxyphenol, p-butoxyphenol), trimethylphenols (e.g., 2,3,5-trimethylphenol, 3,4,5-trimethylphenol, 2,3,6-trimethylphenol), alkenylphenols (e.g., o-vinylphenol, m-vinylphenol, p-vinylphenol, o-allylphenol, m-allylphenol, p-allyphenol), arylphenols (e.g., o-phenylphenol, m-phenylphenol, p-phenylphenol), aralkylphenols (e.g., o-benzylphenol, m-benzylphenol, p-benzylphenol), alkoxycarbonylphenols (e.g., o-methoxycarbonylphenol, m-methoxycarbonylphenol, p-methoxycarbonylphenol), arylcarbonylphenols (e.g., o-benzoyloxyphenol, m-benzoyloxyphenol, p-benzoyloxyphenol), halogenated phenols (e.g., o-chlorophenol, m-chlorophenol, p-chlorophenol), polyhydroxybenzenes (e.g., catechol, resorcinol, hydroquinone, phloroglucinol, pyrogallol). However, the phenols used in the present invention are not limited thereto.

Of these, preferred are phenol, cresols, xylenols and trimethylphenols. More preferred are m-cresol, p-cresol, 2,5-xylenol, 3,5-xylenol, 3,4-xylenol, 2,3-xylenol, and 2,3,5-trimethylphenol.

These phenols can be used singly or as mixtures of two or more of them. In order to sufficiently ensure the effect of the present invention, it is more preferred to use a combination of three phenols, or m-cresol, p-cresol and 2,5-xylenol.

For $R_4$ to $R_7$ in formula (2), the halogen atom is preferably a chlorine atom, a bromine atom or an iodine atom; and the alkyl group is preferably an alkyl group having from 1 to 4 carbon atoms, such as a methyl group, an ethyl group, a propyl group, an n-butyl group, an isobutyl group, a sec-butyl group or a t-butyl group, and it is especially preferably a methyl group in view of the sensitivity of the photoresist of the invention. The cycloalkyl group is preferably a cyclopropyl group, a cyclopentyl group, a cyclohexyl group, a cycloheptyl group or a cyclooctyl group, more preferably a cyclohexyl group. The alkoxy group is preferably an alkoxy group having from 1 to 4 carbon atoms, such as a methoxy group, an ethoxy group, a hydroxyethoxy group, a propoxy group, a hydroxypropoxy group, an isopropoxy group, an n-butoxy group, an isobutoxy group, a sec-butoxy group or a t-butoxy group, more preferably a methoxy group or an ethoxy group. The alkenyl group is preferably an alkenyl group having from 2 to 4 carbon atoms, such as a vinyl group, a propenyl group, an allyl group or a butenyl group, more preferably a vinyl group or an allyl group. The aryl group is preferably a phenyl group, a xylyl group, a toluyl group or a cumenyl group, more preferably a phenyl group. The aralkyl group is preferably a benzyl group, a phenethyl group or a cumyl group, more preferably a benzyl group.

Specific examples of cycloalkylidene-bisphenols of formula (2) are mentioned below, however, the present invention is not limited thereto.

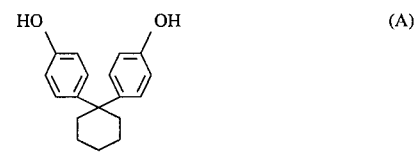

(A)

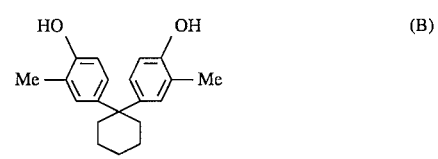

(B)

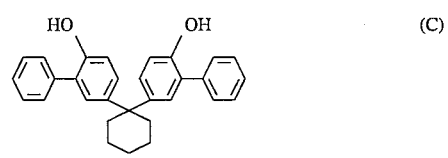

(C)

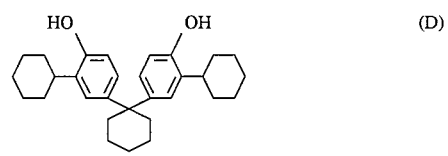

(D)

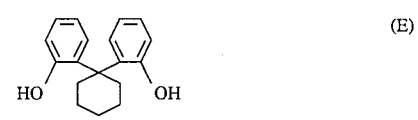

(E)

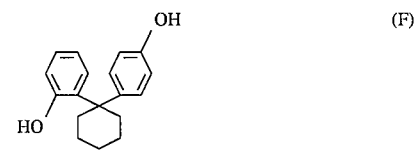

(F)

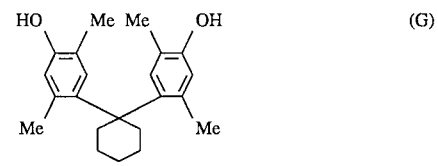

(G)

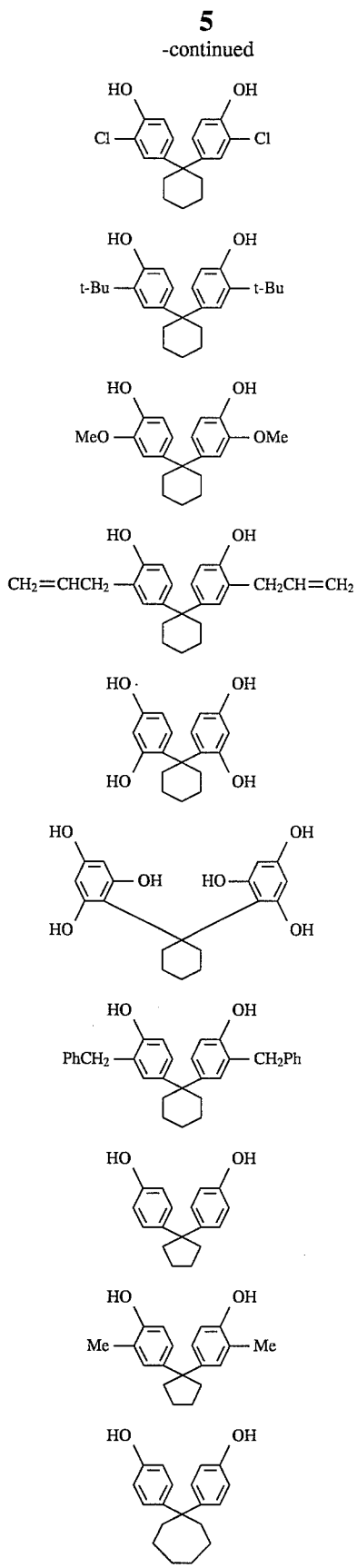

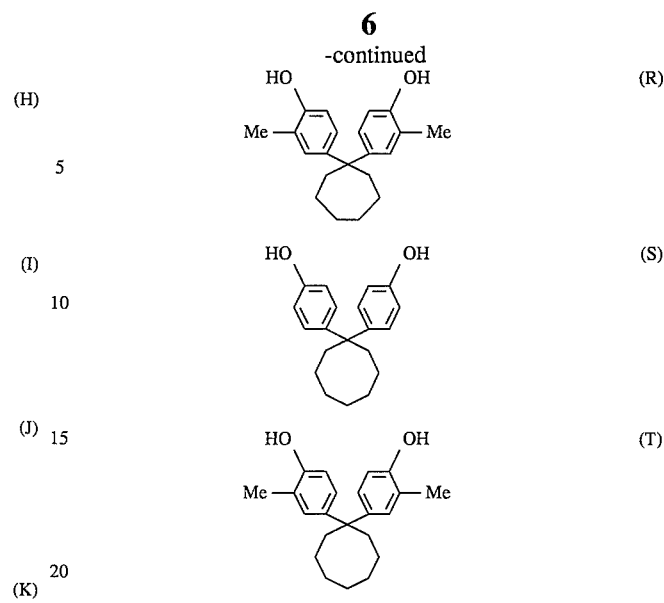

Note: Me, Bu and Ph represent a methyl group, a butyl group and a phenyl group, respectively.

Of the above-mentioned compounds, more preferred are (A), (B), (G), (O) and (P). Especially preferred are (A) and (B).

With respect to the ratio of phenols represented by formula (1) to cycloalkylidene-bisphenols represented by formula (1) in mixing them, the cycloalkylidene-bisphenols may be in necessary amounts to be able to sufficiently exhibit the effect of the present invention and their amounts are not specifically defined. In general, however, when the proportion of the cycloalkylidene-bisphenols is high, the sensitivity of the photoresist of the present invention is lowered. Therefore, it is preferred that the proportion of the phenols represented by formula (1) is 60 mol % or more while that of the cycloalkylidene-bisphenols represented by formula (2) is less than 40 mol %. The proportion of the cycloalkylidene-bisphenols is more preferably from 0.1 mol % to less than 20 mol %, even more preferably from 1 mol % to less than 10 mol %.

In order to sufficiently exhibit the effect of the present invention, preferably used is a mixture of three phenols represented by formula (1), or m-cresol, p-cresol and 2,5-xylenol. Especially preferably, such a mixture is mixed with cycloalkylidene-bisphenols represented by formula (2) at the following proportions:
  m-cresol: from 40 mol % to less than 80 mol %
  p-cresol: from 1 mol % to less than 40 mol %
  2,5-xylenol: from 1 mol % to less than 40 mol %
  cycloalkylidene-bisphenols: less than 40 mol %
More preferably;
  m-cresol: from 50 mol % to less than 70 mol %
  p-cresol: from 1 mol % to less than 30 mol %
  2,5-xylenol: from 1 mol % to less than 30 mol %
  cycloalkylidene-bisphenols: from 0.1 mol % to less than 20 mol %
Even more preferably;
  m-cresol: from 50 mol % to less than 70 mol %
  p-cresol: from 5 mol % to less than 30 mol %
  2,5-xylenol: from 5 mol % to less than 30 mol %
  cycloalkylidene-bisphenols: from 0.1 mol % to less than 10 mol %

Examples of the aldehydes for use in the present invention include formaldehyde, paraformaldehyde, trioxane, acetaldehyde, furfural, benzaldehyde, hydroxybenzaldehyde, crotonaldehyde, and chloroacetaldehyde. Of these, preferred are formaldehyde and paraformaldehyde. In addition, methylol compounds that are obtained by reacting phenols represented by formula (1) and cycloalkylidene-bisphenols represented by formula (2) with formaldehyde under basic conditions can also be used as formaldehyde precursors.

These aldehydes are used singly or as mixtures of two or more of them.

The aldehydes are preferably used in an amount of from 0.4 to 2.0 mol, more preferably from 0.5 to 1.2 mol, per mol of the compounds represented by formulae (1) and (2).

Examples of acid catalyst for the condensation reaction include hydrochloric acid, sulfuric acid, formic acid, acetic acid, and oxalic acid. Above all, oxalic acid is preferred.

The novolak resins for use in the present invention, which are obtained by the methods mentioned above, preferably have a weight average molecular weight of from 2,000 to 30,000. If they have a weight average molecular weight of less than 2,000, the resist film in the non-exposed area after development will be greatly thinned. However, if they have a weight average molecular weight of more than 30,000, the speed of developing the resist film will be lowered and the sensitivity of the resist will be lowered. It is especially preferred to remove the low-molecular components from the novolak resins by the methods disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, and JP-A-4-122938, for example, by fractional precipitation, fractional dissolution, or column chromatography. This is because, when the novolak resins from which the low-molecular components have been removed are used in the present invention, the scum to remain on the resist film after development is reduced and the heat resistance of the resist film is improved. The amount of the low-molecular components to be removed from the novolak resins is preferably from 20% by weight to 70% by weight, more preferably from 30% by weight to 60% by weight. It is preferred that the novolak resins, from which the low-molecular components have been removed, have a weight average molecular weight of from 5,000 to 20,000.

In the present invention, the low-molecular components are preferably components having a weight average molecular weight of 3,000 or less, more preferably 2,000 or less.

The weight average molecular weight as referred to herein is defined in terms of the value of polystyrene to be measured by gel permeation chromatography (GPC).

The novolak resins preferably have a degree of dispersion (to be represented by a ratio of the weight average molecular weight Mw to the number average molecular weight Mn, or Mw/Mn) of from 1.5 to 7.0, more preferably from 1.5 to 4.0. If the degree is more than 7.0, the sensitivity and the heat resistance of the photoresist composition are lowered and the profile of the resist pattern to be formed from the photoresist composition is worsened. However, if it is less than 1.5, high-level purification is needed in producing the novolak resins, which, however, is lacking in the practicable reality. Therefore, the degree of less than 1.5 is not suitable.

The present invention shall use, as a photosensitive component, 1,2-naphthoquinonediazidosulfonyl esters, which are obtained by esterifying polyhydroxy compounds mentioned below with 1,2-naphthoquinonediazido-5- (and/or -4-)sulfonyl chloride in the presence of a basic catalyst.

Examples of the polyhydroxy compounds usable in the present invention include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

polyhydroxyphenylalkylketones such as 2,3,4-trihydroxyacetophenone, 2,3,4-trihydroxyphenylpentylketone, 2,3,4-trihydroxyphenylhexylketone;

bis((poly)hydroxyphenyl)alkanes such as bis(2,4-dihydroxyphenyl)methane, bis(2,3,4-trihydroxyphenyl)methane, bis(2,4-dihydroxyphenyl)propane-1, bis-(2,3,4-trihydroxyphenyl)propane-1, and nordihydroguaiaretic acid;

polyhydroxybenzoates such as propyl 3,4,5-trihydroxybenzoate, phenyl 2,3,4-trihydroxybenzoate, and phenyl 3,4,5-trihydroxybenzoate;

bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

alkylene-di(polyhydroxybenzoates) such as ethylene glycol di(3,5-dihydroxybenzoate), and ethylene glycol di(3,4,5-trihydroxybenzoate);

polyhydroxybiphenyls such as 2,3,4-biphenyltriol, 3,4,5-biphenyltriol, 3,5,3',5'-biphenyltetrol, 2,4,2',4' -biphenyltetrol, 2,4,6,3',5'-biphenylpentol, 2,4,6,2',4',6'-biphenylhexol, and 2,3,4,2',3',4'-biphenylhexol;

bis(polyhydroxy)sulfides such as 4,4'-thiobis(1,3 -dihydroxy)benzene;

bis(polyhydroxyphenyl)ethers such as 2,2',4,4' -tetrahydroxydiphenyl ether;

bis(polyhydroxyphenyl)sulfoxides such as 2,2',4,4'-tetrahydroxydiphenylsulfoxide;

bis(polyhydroxyphenyl)sulfones such as 2,2',4,4'-diphenylsulfone;

polyhydroxytriphenylmethanes such as tris(4 -hydroxyphenyl)methane, 4,4',4"-trihydroxy-3,5,3',5'-tetramethyltriphenylmethane, 4,4',3",4"-tetrahydroxy-3,4,3',5' -tetramethyltriphenylmethane, 4,4',2",3",4"-pentahydroxy-3,5,3',5'-tetramethyltriphenylmethane, 2,3,4,2',3',4' -hexahydroxy-5,5'-diacetyltriphenylmethane, 2,3,4,2',3',4',3",4"-octahydroxy-5,5'-diacetyltriphenylmethane, and 2,4,6,2',4',6'-hexahydroxy-5,5'-dipropionyltriphenylmethane;

polyhydroxyspirobi-indanes such as 3,3,3',3' -tetramethyl-1,1'-spirobi-indane-5,6,5',6'-tetrol, 3,3,3',3'-tetramethyl-1,1'-spirobi-indane-5,6,7,5',6',7' -hexol, 3,3,3',3'-tetramethyl-1,1'-spirobi-indane-4,5,6,4',5',6'-hexol, and 3,3,3',3'-tetramethyl-1,1' -spirobi-indane-4,5,6,5',6',7'-hexol;

polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro[phthalide-3,9'-xanthene];

flavono dyes such as morin, quercetin, and rutin;

polyhydroxy compounds described in JP-A 4-253058, such as α,α',α"-tris(4-hydroxyphenyl)-1,3,5-triisopropylbenzene, α,α',α"-tris(3,5-dimethyl-4-hydroxyphenyl)-1,3,5 -triisopropylbenzene, α,α',α"-tris(3,5-diethyl-4-hydroxyphenyl)- 1,3,5-triisopropylbenzene, α,α',α"-tris(3,5-di-n-propyl- 4-hydroxyphenyl)-1,3,5-triisopropylbenzene, α,α',α41 -tris(3,5-di-isopropyl-4-hydroxyphenyl)-1,3,5 -triisopropylbenzene, α,α',α41 -tris(3,5-di-n-butyl-4 -hydroxyphenyl)-1,3,5-triisopropylbenzene, α,α',α41 -tris(3 -methyl-4-hydroxyphenyl)-1,3,5-triisopropylbenzene, α,α',α"-tris(3-methoxy-4-hydroxyphenyl)-1,3,5-triisopropylbenzene, α,α',α"-tris(2,4-dihydroxyphenyl)-1,3,5 -triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)-ethyl]benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene, and 1 -[α-methyl-α-(2',4'-dihydroxyphenyl)ethyl]-3-[α',α'-bis(4"-hydroxyphenyl)ethyl]benzene;

as well as p-bis(2,3,4-trihydroxybenzoyl)benzene, p-bis(2,4,6-trihydroxybenzoyl)benzene, m-bis(2,3,4 -trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4 -trihydroxy-5-methoxybenzoyl)benzene, p-bis(2,3,4 -trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris-(2,3,4-trihydroxybenzoyl)benzene, 1,2,4,5-tetrakis(2,3,4 -trihydroxybenzoyl)benzene, α,α'-bis(2,3,4-trihydroxybenzoyl)-p-xylene, α,α',α'-tris(2,3,4-trihydroxybenzoyl)mesithylene, 2,6-bis(2'-hydroxy-3',5'-dimethyl-benzyl)-p-cresol, 2,6-bis(2'-hydroxy-5'-methylbenzyl)-p-cresol, 2,6-bis-(2'-hydroxy-3',5'-di-t-butylbenzyl)-p-cresol, 2,6-bis-(2'-hydroxy-5'-ethyl-benzyl)-p-cresol, 2,6-bis-(2',4' -dihydroxy-benzyl)-p-cresol, 2,6-bis-(2'-hydroxy-3' -t-butyl-5'-methyl-benzyl)-p-cresol, 2,6-bis-(2',3',4' -trihydroxy-5'-acetyl-benzyl)-p-cresol, 2,6-bis-(2',4',6' -trihydroxy-benzyl)-p-cresol, 2,6-bis-(2',3',4'-trihydroxybenzyl)-p-cresol, 2,6-bis(2',3',4'-trihydroxy-benzyl)-3,5 -dimethyl-phenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)- 1,3,4-trihydroxy-phenol, 4,6-bis-(2',4',6' -trihydroxybenzyl)-2,4-dimethyl-phenol, and 4,6'-bis-(2',3',4'-trihydroxy-benzyl)-2,5-dimethyl-phenol.

In addition to these, low-nuclear phenolic resins such as novolak resins can also be used.

Further, the following polyhydroxy compounds may also be used.

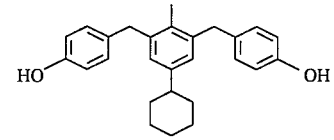 (5)

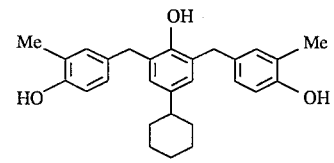 (6)

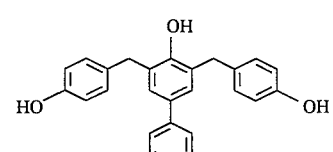 (7)

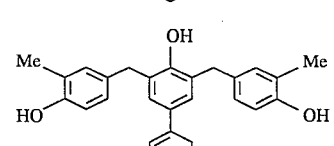 (8)

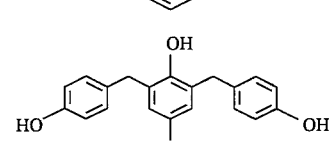 (9)

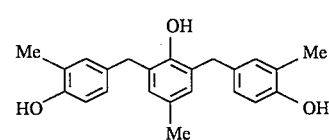 (10)

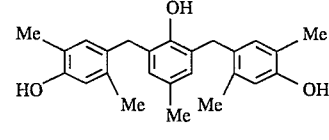 (11)

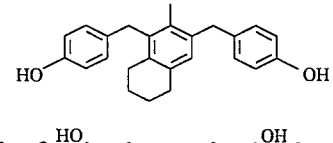 (12)

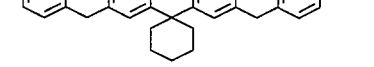 (13)

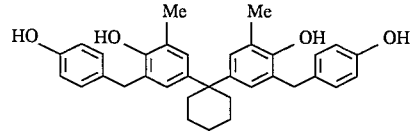 (14)

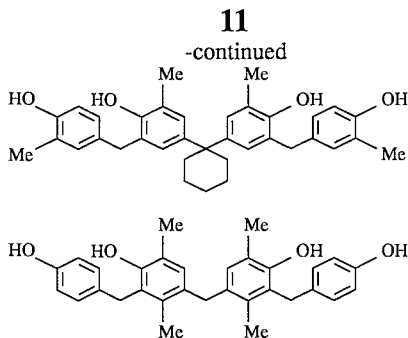

Of the above-mentioned polyhydroxy compounds, more preferred are compounds represented by formulae (5) to (16), even more preferred are compounds represented by formulae (5), (7) and (15). These can be used as their mixtures thereof. Most preferably, the photosensitive compound derived from the compound represented by formula (5) is mixed with the photosensitive compound derived from the compound represented by formula (15). The photoresist composition containing the resulting mixture can sufficiently exhibit the effect of the present invention.

The esterification to obtain the photosensitive compounds for use in the present invention is conducted by dissolving pre-determined amounts of the polyhydroxy compound and 1,2-naphthoquinonediazido-5- (and/or -4-)sulfonyl chloride in a solvent, such as dioxane, acetone, tetrahydrofuran, methyl ethyl ketone, N-methylpyrrolidone, chloroform, trichloroethane, trichloroethylene, or dichloroethane, followed by dropwise adding thereto a basic catalyst, such as sodium hydroxide, sodium carbonate, sodium hydrogencarbonate, triethylamine, N-methylmorpholine, N-methylpiperazine, or 4-dimethylaminopyridine, in the presence of which catalyst, the compounds are condensed. The thus-obtained products are washed, then purified and dried.

Ordinary esterification gives mixtures of esters having different degrees of esterification and having been esterified at different positions. However, if the esterifying conditions and the structures of the polyhydroxy compounds to be esterified are suitably selected, only specific isomers can be selectively esterified. The degree of esterification as referred to herein indicates the average of the degrees of esterification of the ester mixtures.

The degree of esterification thus defined can be controlled by selecting the mixing ratio of the raw materials, the polyhydroxy compound and the 1,2 -naphthoquinonediazido-5- (and/or -4-)sulfonyl chloride to be reacted. Since substantially all the 1,2 -naphthoquinonediazido-5- (and/or -4-)sulfonyl chloride added to the polyhydroxy compound is esterified with the latter, the molar ratio of these raw materials are controlled in order to obtain an ester mixture having the desired degree of esterification.

If desired, a combination of 1,2-naphthoquinonediazido-5-sulfonyl chloride and 1,2-naphthoquinonediazido-4-sulfonyl chloride can be employed.

The reaction temperature for the above-mentioned esterification is generally from −20° C. to 60° C., preferably from 0° C. to 40° C.

One or more of the photosensitive compounds that are produced according to the method mentioned above can be mixed with an alkali-soluble resin component to prepare the photoresist composition of the present invention. The proportion of the former to be added to the latter is from 5 to 100 parts by weight, preferably from 20 to 60 parts by weight, based on 100 parts by weight of the novolak resin in the latter. If the proportion is less than 5 parts by weight, the scum to remain on the photoresist film after development will increase. However, if it is more than 100 parts by weight, the sensitivity of the photoresist will be lowered and the solubility of the same in solvents will also be lowered.

The composition of the present invention may further contain polyhydroxy compounds, by which the solubility of the composition in developers is promoted. Preferred polyhydroxy compounds for this purpose include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensate resins, phloroglucide, 2,4,2',4'-biphenyltetrol, 4,4'-thiobis(1,3-dihydroxy)benzene, 2,2',4,4' -tetrahydroxydiphenyl ether, 2,2',4,4'-tetrahydroxydiphenylsulfoxide, 2,2',4,4'-tetrahydroxydiphenylsulfone, tris(4-hydroxyphenyl)methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4 -hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and para-[α,α,α',α'-tetrakis(4-hydroxyphenyl)]-xylene.

These polyhydroxy compounds may be added to the composition of the present invention in an amount of generally 100 parts by weight or less, preferably from 5 to 50 parts by weight, based on 100 parts by weight of the quinonediazide compound in the composition.

Solvents which dissolve the photosensitive substances and the alkali-soluble novolak resins of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2 -hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents can be used singly or as a mixture of two or more of them.

If desired, high boiling point solvents, such as N-methylformamide, N,N-dimethylformamide, N-methylacetamide, N,N-dimethylacetamide, N-methylpyrrolidone, dimethylsulfoxide, and benzyl ethyl ether, can be added to these solvents.

The positive photoresist composition of the present invention may contain a surfactant, by which the coatability of the composition is improved and the coated film of the composition is free from striation.

Examples of usable surfactants include nonionic surfactants, for example, polyoxyethylene alkyl ethers (e.g., polyoxyethylene lauryl ether, polyoxyethylene stearyl ether, polyoxyethylene cetyl ether, polyoxyethylene oleyl ether); polyoxyethylene alkylaryl ethers (e.g., polyoxyethylene octylphenol ether, polyoxyethylene nonylphenol ether); polyoxyethylene-polyoxypropylene block copolymers; sorbitan fatty acid esters (e.g., sorbitan monolaurate, sorbitan monopalmitate, sorbitan monostearate, sorbitan monooleate, sorbitan trioleate, sorbitan tristearate); fatty acid esters of polyoxyethylene sorbitan (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine surfactants, for example, Eftop EF301, EF303, EF352 (all products of Shin-Akita Chemical Co., Ltd.), Megafac F171, F173 (both products of DAINIPPON INK AND CHEMICALS, INC.), Florad FC430, FC431 (both products of SUMITOMO 3M LIMITED), Asahiguard AG710, Surfton S-382, SC101, SC102, SC103, SC104, SC105, SC106 (all products of Asahi Glass Co., Ltd.); as well as organosiloxane polymer, KP341 (product by Shin-etsu Chemical Co., Ltd.), acrylic or methacrylic acid type (co)polymers, Polyflow No. 75, No. 95 (both products of Kyouei-sha Oils & Fats Chemical Industry Co., Ltd.). Of these surfactants, especially preferred are fluorine surfactants and silicone surfactants. The content of these surfactants in the composition of the present invention may be generally 2 parts by weight or less, preferably 1 part by weight or less, based on 100 parts by weight of the alkali-soluble resin and the quinonediazide compound in the composition.

These surfactants may be added to the composition of the present invention either singly or as a combination of two or more of them.

Developer to develop the positive photoresist composition of the present invention include aqueous solutions of alkalies, for example, inorganic alkalies (e.g., sodium hydroxide, potassium hydroxide, sodium carbonate, sodium silicate, sodium metasilicate, aqueous ammonia); primary amines (e.g., ethylamine, n-propylamine); secondary amines (e.g., diethylamine, di-n-butylamine); tertiary amines (e.g., triethylamine, methyldiethylamine); alcoholamines (e.g., dimethylethanolamine, triethanolamine); quaternary ammonium salts (e.g., tetramethylammonium hydroxide, tetraethylammonium hydroxide, choline); and cyclic amines (e.g., pyrrole, piperidine). These aqueous alkali solutions may contain, if desired, suitable amounts of alcohols such as isopropyl alcohol or surfactants such as nonionic surfactants.

The positive photoresist composition of the present invention may contain, if desired, a light-absorbing agent, a crosslinking agent, or an adhesive aid. The light-absorbing agent is added, if necessary, to the composition for the purpose of preventing halation from the support or for the purpose of elevating visibility of the film of the composition when coated on a transparent support. For instance, usable are commercial light-absorbing agents such as those described in *Technology and Market of Industrial Dyes* (published by CMC), *Handbook for Dyes* (edited by Association of Organic Synthetic Chemistry). Above all, preferred are C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.D. Disperse Violet 43; C.I. Disperse Blue 96; C.I. Fluorescent Brightening Agent 112, 135 and 163; C.I. Solvent Yellow 14, 16, 33 and 56; C.I. Solvent Orange 2 and 45; C.I. Solvent Red 1, 3, 8, 23, 24, 25, 27 and 49; C.I. Pigment Green 10; and C.I. Pigment Brown 2. The light-absorbing agent may be incorporated into the composition of the present invention in an amount of generally 100 parts by weight or less, preferably 50 parts by weight or less, more preferably 30 parts by weight or less, based on 100 parts by weight of the alkali-soluble resin in the composition.

The crosslinking agent is added to the composition of the present invention within such a range that it has no influence on the formation of positive images from the composition. The object of adding the crosslinking agent to the composition is essentially to control the sensitivity of the composition, to improve the heat resistance of the composition and to improve the dry-etching resistance of the same.

Examples of the crosslinking agent include compounds to be obtained by reacting formaldehyde and melamine, benzoguanamine, or glycoluril; their alkyl-modified derivatives, epoxy compounds, aldehydes, azides, organic peroxides, and hexamethylenetetramine. These crosslinking agents may be incorporated into the composition of the present invention in an amount of less than 10 parts by weight, preferably less than 5 parts by weight, based on 100 parts of the photosensitive substance in the composition. If the amount of the crosslinking agent in the composition is 10 parts by weight or more, the sensitivity of the composition is unfavorably lowered with the result that the resist gives scum (resist residue) after development.

An adhesive aid is added, if desired, to the composition of the present invention for the purpose of improving adhesiveness between the substrate and the resist, by which the resist is not peeled during etching. Examples of the adhesive aid include chlorosilanes (e.g., trimethylchlorosilane, dimethylvinylchlorosilane, methyldiphenylchlorosilane, chloromethyldimethylchlorosilane); alkoxysilanes (e.g., trimethylmethoxysilane, dimethyldiethoxysilane, methyldimethoxysilane, dimethylvinylethoxysilane, diphenyldimethoxysilane, phenyltriethoxysilane); silazanes (e.g., hexamethyldisilazane, N,N'-bis(trimethylsilyl)urea, dimethyltrimethylsilylamine, trimethylsilylimidazole); silanes (e.g., vinyltrichlorosilane, γ-chloropropyltrimethoxysilane, γ-aminopropyltriethoxysilane, γ-glycidoxypropyltrimethoxysilane); heterocyclic compounds (e.g., benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine); urea compounds (e.g., 1,1-dimethylurea, 1,3-dimethylurea); and thiourea compounds.

These adhesive aids may be added to the composition of the present invention in an amount of generally less than 10 parts by weight, preferably less than 5 parts by weight, based on 100 parts of the alkali-soluble resin in the composition.

The above-mentioned positive photoresist composition of the present invention is coated on substrates, such as those to be used in production of precision integrated circuit devices (e.g., transparent substrates, such as glass substrate, or ITO substrate, coated with silicon/silicon dioxide), by means of suitable coating methods using a spinner, or a coater, then pre-baked, exposed through a pre-determined mask, optionally post-baked (for PEB: post exposure bake), developed, rinsed and dried to give good resist patterns.

The present invention will be explained in more detail by means of the following examples, which, however, are not intended to restrict the scope of the present invention. Unless otherwise specifically indicated, "%" is by weight.

EXAMPLES (1) Production of Novolak Resin (a-1):

m-Cresol (129.77 g), 32.44 g of p-cresol, 48.87 g of 2,5-xylenol, 29.64 g of 4,4'-cyclohexylidene-bis[3-methylphenol] (Compound (B) mentioned hereinabove) and 145.03 g of aqueous solution of formalin (37.27%) were put into a one-liter three-neck flask, and 0.75 g of oxalic acid were added thereto while stirring at 90° C. After one hour, the bath temperature was elevated up to 115° C. and the stirring was conducted for further 3 hours.

Next, the reflux condenser was replaced by a Liebig condenser, the bath temperature was gradually elevated up to 200° C., and the non-reacted formalin and water were removed. After this was distilled under normal pressure for 2 hours, the pressure was gradually reduced to 1 mmHg, and the non-reacted monomers were removed.

The molten alkali-soluble novolak resin thus formed was collected, after cooled to room temperature. The thus-obtained novolak resin (a-1) had a weight average molecular weight of 4,040 (in terms of polystyrene) and a degree of dispersion of 3.83.

(2) Production of Novolak Resins (b-1) to (1-1):

Pre-determined amounts (as mol %) of the monomers and the cycloalkylidene-bisphenol compound shown in Tables 1 and 2 below (where the parenthesized letters correspond to the compounds mentioned hereinabove) were condensed with formaldehyde in the same manner as in the above-mentioned (1) to obtain novolak resins (b-1) to (1-1). In Table 1, (X) is the following compound:

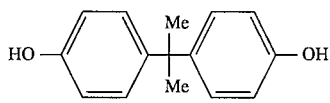

TABLE 1

Production of Novolak Resins (mol % of raw materials fed into reactor)

| Novolak Resin | m-Cresol | p-Cresol | 2,5-Xylenol | Cycloalkylidene Compound | Mw |
|---|---|---|---|---|---|
| a-1 | 60 | 15 | 20 | (B) 5 | 4040 |
| b-1 | 60 | 5 | 5 | (B) 30 | 3440 |
| c-1 | 70 | 0 | 15 | (B) 15 | 4200 |
| d-1 | 70 | 20 | 0 | (A) 10 | 6120 |
| e-1 | 60 | 15 | 20 | (A) 5 | 4560 |
| f-1 | 60 | 15 | 20 | (O) 5 | 7630 |
| g-1 | 60 | 40 | 0 | — | 5150 |
| h-1 | 60 | 15 | 20 | (X) 5 | 4370 |
| i-1 | 60 | 20 | 20 | — | 4470 |

TABLE 2

Production of Novolak Resins (mol % of raw materials fed into reactor)

| Novolak Resin | m-Cresol | p-Cresol | Xylenol or Trimethylphenol | | Cycloalkylidene Compound | Mw |
|---|---|---|---|---|---|---|
| j-1 | 60 | 15 | 3,5-xylenol | 20 | (A) 5 | 4010 |
| k-1 | 60 | 15 | 2,3,5-trimethylphenol | 20 | (B) 5 | 4630 |
| 1-1 | 70 | 0 | 2,3,5-trimethylphenol | 20 | (A) 10 | 4980 |

(3) Production of Fractionated Novolak Resins (a-2) to (1-2):

One hundred g of each of novolak resins (a-1) to (1-1) obtained in the above-mentioned (1) and (2) were dissolved in acetone, and 1,000 g to 1,600 g of n-hexane were added thereto while stirring. After stirred for 30 minutes, these were allowed to statically stand for 1 hour. The upper layer was removed by decantation, and the solvent was removed from the the remaining lower layer with a rotary evaporator. Thus, solid novolak resins (a-2) to (1-2) were obtained.

TABLE 3

| Fractionated Novolak Resins | | |
|---|---|---|
| Novolak Resin | Percentage of Removal of Low-Molecular Components (%) | Mw |
| a-2 | 55 | 7120 |
| b-2 | 60 | 6770 |
| c-2 | 61 | 7650 |

TABLE 3-continued

| Fractionated Novolak Resins | | |
|---|---|---|
| Novolak Resin | Percentage of Removal of Low-Molecular Components (%) | Mw |
| d-2 | 38 | 10120 |
| e-2 | 53 | 8060 |
| f-2 | 42 | 12180 |
| g-2 | 63 | 11090 |
| h-2 | 54 | 7710 |
| i-2 | 50 | 8710 |
| j-2 | 47 | 6920 |
| k-2 | 45 | 8160 |
| 1-2 | 49 | 9190 |

(4) Production of Photosensitive Substance (A-1):

Compound (5) (38.9 g), 53.7 g of 1,2-naphthoquinonediazido-5-sulfonyl chloride and 800 ml of acetone were put into a three-neck flask and uniformly dissolved therein. Next, 20.8 g of N-methylpiperidine were gradually and dropwise added thereto and these were reacted at 25° C. for 3 hours. The reaction mixture was poured into 3 liters of aqueous solution of 1% hydrochloric acid, and the precipitate formed was taken out by filtration, washed with water and dried to obtain 76.8 g of photosensitive substance (A-1).

(5) Production of Photosensitive Substance (B-1):

Compound (15) (53.7 g), 53.7 g of 1,2-naphthoquinonediazido- 5-sulfonyl chloride and 800 ml of acetone were put into a three-neck flask and uniformly dissolved therein. Next, 21.2 g of triethylamine were gradually and dropwise added thereto and these were reacted at 25° C. for 3 hours. The reaction mixture was poured into 3 liters of aqueous solution of 1% hydrochloric acid, and the precipitate formed was taken out by filtration, washed with water and dried to obtain 90.2 g of photosensitive substance (B-1).

(6) Production of Photosensitive Substance (C-1):

$\alpha,\alpha',\alpha''$-Tris(4-hydroxyphenyl)-1-ethyl-4-isopropylbenzene (35.3 g), 53.7 g of 1,2-naphthoquinonediazido-5-sulfonyl chloride and 800 ml of acetone were put into a three-neck flask and uniformly dissolved therein. Next, 21.2 g of triethylamine were gradually and dropwise added thereto and these were reacted at 25° C. for 3 hours. The reaction mixture was poured into 3 liters of aqueous solution of 1% hydrochloric acid, and the precipitate formed was taken out by filtration, washed with water and dried to obtain 75.0 g of photosensitive substance (C-1).

(7) Production of Photosensitive Substance (D-1):

2,3,4,4'-Tetrahydroxybenzophenone (19.19 g), 53.7 g of 1,2-naphthoquinonediazido-5-sulfonyl chloride and 800 ml of acetone were put into a three-neck flask and uniformly dissolved therein. Next, 21.2 g of triethylamine were gradually and dropwise added thereto and these were reacted at 25° C. for 3 hours. The reaction mixture was poured into 3 liters of aqueous solution of 1% hydrochloric acid, and the precipitate formed was taken out by filtration, washed with water and dried to obtain 62.3 g of photosensitive substance (D-1).

(8) Preparation and Evaluation of Positive Photoresist Compositions:

Novolak resins (a-1) to (1-1) and (a-2) to (1-2) obtained in the above-mentioned (1) to (3), photosensitive substances (A-1) to (D-1) obtained in the above-mentioned (4) to (7), solvent and, if needed, polyhydroxy compound were mixed at the ratios (parts by weight) indicated in Table 4 below to obtain uniform solutions. These were filtered through a microfilter having a pore size of 0.10 μm to prepare photoresist compositions. These photoresist compositions were coated on silicon wafers, using a spinner, and dried on a vacuum suction hot plate at 90° C. for 60 seconds to form resist films.

These films were exposed, using a reduction-projecting exposer (NSR-2005i9C; produced by NIKON CORPORATION), then baked at 110° C. for 60 seconds (PEB), thereafter developed with an aqueous solution of 2.38% tetramethylammonium hydroxide for 1 minute, rinsed with water for 30 seconds and dried.

The resist patterns thus formed on the silicon wafers were observed with a scanning electronic microscope to evaluate the resists. The results are shown in Table 5.

The sensitivity was defined by the reciprocal of the exposure amount needed for reproducing the mask pattern of 0.60 μm and was represented as the relative value based on the sensitivity of the resist film of Comparative Example 1.

The resolution represents a limiting resolution at the exposure amount needed for reproducing the mask pattern of 0.60 μm.

To evaluate the heat resistance, the silicon wafer having a resist pattern formed thereon was baked on a hot plate for 4 minutes while observing the deformation, if any, of the pattern. The heat resistance was represented by the temperature at which the pattern did not deform.

The profile of the resist was represented by the angle (θ) formed by the resist wall and the plane of the silicon wafer in the cross section of the resist pattern having a thickness of 0.50 μm.

To determine the scum (resist residue) after development, the silicon wafer having a 0.50-μm resist pattern formed thereon was observed. In Table 5, "good" means that no scum remained on the pattern; "fair" means that some scum remained thereon; and "bad" means that much scum remained thereon.

TABLE 4

Formulations of Positive Photoresist Compositions

| | Novolak Resin | | Photosensitive Substance | | Polyhydroxy Compound | | Solvent | |
|---|---|---|---|---|---|---|---|---|
| No. | Kind | Amount Added | Kind | Amount Added | Kind(*1) | Amount Added | Kind(*2) | Amount Added |
| Example 1 | a-1 | 100 | A-1 | 27 | — | — | S-1 | 350 |
| Example 2 | b-1 | 100 | A-1 | 25 | — | — | S-1 | 340 |
| Example 3 | c-1 | 100 | B-1 | 29 | — | — | S-2 | 380 |
| Example 4 | d-1 | 100 | B-1 | 28 | — | — | S-2 | 380 |
| Example 5 | e-1 | 100 | A-1/B-1 | 13/17 | — | — | S-2/S-4 | 285/95 |
| Example 6 | f-1 | 100 | A-1/B-1 | 14/14 | — | — | S-3 | 360 |
| Example 7 | j-1 | 100 | C-1 | 26 | — | — | S-1 | 350 |
| Example 8 | k-1 | 100 | A-1 | 27 | — | — | S-3 | 360 |
| Example 9 | l-1 | 100 | B-1 | 27 | — | — | S-2 | 380 |
| Example 10 | a-2 | 82 | B-1 | 28 | P-1 | 18 | S-1 | 350 |
| Example 11 | b-2 | 79 | A-1 | 26 | P-1 | 21 | S-2 | 380 |
| Example 12 | c-2 | 80 | A-1 | 28 | P-1 | 20 | S-2 | 380 |
| Example 13 | d-2 | 76 | C-1 | 27 | P-2 | 24 | S-2/S-4 | 285/95 |
| Example 14 | e-2 | 74 | A-1/B-1 | 12/22 | P-1 | 26 | S-2/S-4 | 285/95 |
| Example 15 | f-2 | 72 | A-1/B-1 | 10/19 | P-3 | 28 | S-3 | 360 |
| Example 16 | j-2 | 75 | A-1 | 24 | P-3 | 25 | S-2 | 380 |
| Example 17 | k-2 | 74 | A-1/B-1 | 15/15 | P-3 | 26 | S-2/S-4 | 285/95 |
| Example 18 | l-2 | 72 | A-1 | 28 | P-3 | 28 | S-2 | 380 |
| Comparative Example 1 | g-1 | 100 | D-1 | 25 | — | — | S-1 | 350 |
| Comparative Example 2 | h-1 | 100 | A-1 | 27 | — | — | S-1 | 350 |
| Comparative Example 3 | i-1 | 100 | D-1 | 26 | — | — | S-1 | 350 |
| Comparative Example 4 | g-2 | 80 | C-1 | 28 | P-2 | 20 | S-2 | 380 |
| Comparative Example 5 | h-2 | 79 | C-1 | 29 | P-1 | 21 | S-2 | 380 |
| Comparative Example 6 | i-2 | 75 | D-1 | 27 | P-3 | 25 | S-3 | 360 |
| Comparative Example 7 | h-2 | 80 | B-1 | 29 | P-2 | 20 | S-3 | 360 |

*1: P-1: α,α,α'-tris(4-hydroxyphenyl)-1-ethyl-4-isopropylbenzene
P-2: tris(4-hydroxyphenyl)methane
P-3: 1,1-bis(4-hydroxyphenyl)cyclohexane
*2: S-1: ethyl cellosolve acetate
S-2: ethyl 2-hydroxypropionate
S-3: methyl 3-methoxypropionate
S-4: ethyl 3-ethoxypropionate

TABLE 5

| Example No. | Relative Sensitivity | Resolution (μm) | Heat Resistance (°C.) | Scum | Profile of Resist (θ) |
|---|---|---|---|---|---|
| Example 1 | 1.2 | 0.32 | 150 | good | 88 |
| Example 2 | 1.1 | 0.32 | 145 | good | 88 |
| Example 3 | 1.3 | 0.32 | 150 | good | 88 |
| Example 4 | 1.2 | 0.32 | 150 | good | 88 |
| Example 5 | 1.2 | 0.32 | 150 | good | 88 |
| Example 6 | 1.2 | 0.32 | 155 | good | 88 |
| Example 7 | 1.1 | 0.32 | 150 | good | 87 |
| Example 8 | 1.2 | 0.32 | 150 | good | 88 |
| Example 9 | 1.2 | 0.32 | 160 | good | 88 |
| Example 10 | 1.3 | 0.28 | 160 | good | 89 |
| Example 11 | 1.3 | 0.28 | 160 | good | 89 |
| Example 12 | 1.2 | 0.28 | 160 | good | 89 |
| Example 13 | 1.2 | 0.28 | 165 | good | 87 |
| Example 14 | 1.1 | 0.28 | 160 | good | 89 |
| Example 15 | 1.2 | 0.28 | 165 | good | 89 |
| Example 16 | 1.3 | 0.30 | 160 | good | 89 |
| Example 17 | 1.2 | 0.30 | 160 | good | 89 |
| Example 18 | 1.2 | 0.30 | 160 | good | 89 |
| Comparative Example 1 | 1.0 | 0.45 | 140 | good | 77 |
| Comparative Example 2 | 1.0 | 0.38 | 140 | bad | 84 |
| Comparative Example 3 | 1.1 | 0.35 | 140 | good | 84 |
| Comparative Example 4 | 0.9 | 0.35 | 145 | good | 86 |
| Comparative Example 5 | 1.1 | 0.38 | 145 | fair | 85 |
| Comparative Example 6 | 1.1 | 0.35 | 145 | good | 86 |
| Comparative Example 7 | 1.0 | 0.35 | 145 | fair | 86 |

As has been described in detail hereinabove, the positive photoresist composition of the present invention, containing a particular alkali-soluble novolak resin, has high sensitivity and high resolution and has good resist properties in that the profile of the resist pattern formed is good, little scum remains on the pattern after development and the heat resistance of the resist pattern is good.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising an admixture of an alkali-soluble novolak resin and a 1,2-quinonediazide compound, wherein the alkali-soluble novolak resin contains a novolak resin obtained by condensing
   (a) a mixture of at least one phenol represented by the following formula (1) and at least one compound represented by the following formula (2) and
   (b) at least one aldehyde:

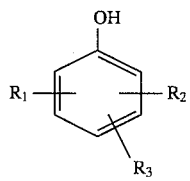
(1)

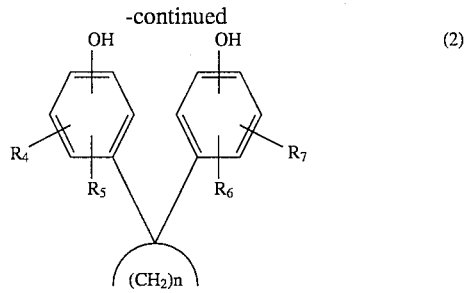
(2)

wherein $R_1$, $R_2$ and $R_3$ are the same or different and each represents a hydrogen atom, a hydroxyl group, a halogen atom, an alkyl group, an alkoxy group, an alkenyl group, an aryl group, an aralkyl group, an alkoxycarbonyl group or an arylcarbonyl group;

$R_4$, $R_5$, $R_6$ and $R_7$ are the same or different and each represents a hydrogen atom, a hydroxyl group, a halogen atom, an alkyl group, a cycloalkyl group, an alkoxy group, an alkenyl group, an aryl group or an aralkyl group; and n represents an integer of from 4 to 7.

2. The positive photoresist composition as claimed in claim 1, wherein the phenol is at least one selected from the group consisting of phenol, cresol, xylenol and trimethylphenol.

3. The positive photoresist composition as claimed in claim 1, wherein the phenol is a mixture of m-cresol, p-cresol and 2,5-xylenol.

4. The positive photoresist composition as claimed in claim 1, wherein the phenol is a mixture of m-cresol, p-cresol and 2,5-xylenol and the compound represented by formula (2) is at least one of compounds represented by the following formulae (3) and (4):
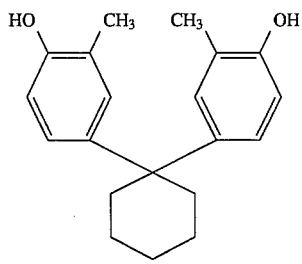
(3)
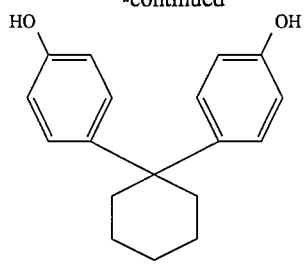
(4)
* * * * *